(12) United States Patent
Farnworth et al.

(10) Patent No.: US 6,351,034 B1
(45) Date of Patent: Feb. 26, 2002

(54) CLIP CHIP CARRIER

(75) Inventors: Warren M. Farnworth, Nampa; Derek Gochnour; Alan Wood, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/088,605

(22) Filed: Jun. 1, 1998

(51) Int. Cl.$^7$ ................................................ H01L 23/34
(52) U.S. Cl. .......................... 257/727; 257/726; 438/15
(58) Field of Search .................................. 324/158, 754, 324/72.5, 73.1; 361/398; 438/18, 15, 17; 257/726, 727

(56) References Cited

U.S. PATENT DOCUMENTS

| | | | |
|---|---|---|---|
| 3,875,478 A | 4/1975 | Capstick | 317/101 |
| 4,783,719 A * | 11/1988 | Jamison et al. | 361/398 |
| 4,904,934 A * | 2/1990 | Nishihashi et al. | 324/158 |
| 5,367,253 A | 11/1994 | Wood et al. | 324/158.1 |
| 5,552,635 A * | 9/1996 | Kim et al. | 257/706 |
| 6,020,597 A * | 2/2000 | Kwak | 257/48 |
| 6,072,322 A * | 6/2000 | Viswanath et al. | 324/754 |
| 6,091,250 A * | 7/2000 | Wood et al. | 324/755 |
| 6,091,251 A * | 7/2000 | Wood et al. | 324/755 |

* cited by examiner

*Primary Examiner*—Carl Whitehead, Jr.
*Assistant Examiner*—Jeff Vockrodt
(74) *Attorney, Agent, or Firm*—Workman, Nydegger & Seeley

(57) ABSTRACT

A chip carrier for temporarily connecting a semiconductor chip to a testing device. The chip carrier includes a substrate having a first set of contact points for electrically engaging the testing device and a second set of contact points to be connected with the contact elements of the semiconductor chip. The semiconductor chip is disposed on the substrate and is substantially covered by a cover member. One or more clips are in contact with the cover member and are used to secure the semiconductor chip in position. The clips have a first member removably attached to the substrate and a second member separated from the first member and in contact with the cover member. As the second member is displaced from an unstressed position, a force is generated by the clip and transferred to the cover member and the semiconductor chip. The chip carrier reliably secures the semiconductor chip while occupying a relatively small space over the semiconductor chip.

26 Claims, 5 Drawing Sheets

CLIP CHIP CARRIER

BACKGROUND OF THE INVENTION

1. The Field of the Invention

The present invention relates to chip carrier devices for temporarily securing semiconductor chips to testing circuitry. In particular, the present invention relates to chip carriers that use C-shaped clips for providing a force on a semiconductor chip in order to temporarily secure the semiconductor chip to electrical contact points on the chip carrier.

2. The Relevant Technology

Frequently, after a semiconductor chip such as an integrated circuit is manufactured, a testing process is conducted on the semiconductor chip by subjecting it to a preselected set of input conditions in order to measure its response and other parameters. The testing process typically involves connecting electrical contact elements of the semiconductor chip to corresponding electrical contact structures on a testing device. Moreover, the connection made with the external circuitry is temporary such that the semiconductor chip may be subsequently removed and shipped to the consumer or used in a manufactured product.

As devices integrated in semiconductor chips continue to become smaller and more tightly packed, it has become increasingly difficult to establish electrical contact between semiconductor chips and external circuitry in testing devices. This is primarily due to the fact that the electrical contact elements and the pitch between nearest adjacent electrical contact elements on the semiconductor chips have progressively become smaller. It has been difficult and expensive to design testing devices that have electrical contact structures that are sufficiently small to be compatible with the contact elements of conventional semiconductor chips.

Some of the difficulties associated with testing conventional semiconductor chips have been addressed by using devices known as chip carriers or interposers. A typical chip carrier includes a printed circuit board or another dielectric substrate having electrical traces leading from an array of first contact points on a bottom surface thereof to an array of second contact points on the top surface thereof. The second contact points are typically tightly spaced so as to correspond to the contact elements of the semiconductor chip. In contrast, the first contact points have a greater pitch, or are more widely spaced, in order to electrically engage the external circuitry contained in the testing device.

In practice, testing operations are typically conducted by first temporarily securing a semiconductor chip to the chip carrier. This generally requires aligning the semiconductor chip with the chip carrier such that the contact elements of the semiconductor chip are in contact with the corresponding contact points of the chip carrier. Because the connection should be temporary for testing purposes, the semiconductor chip is normally pressed onto the chip carrier without being soldered thereto. In the past, structures such as that seen in FIG. 1 have been used to temporarily secure the semiconductor chip to the chip carrier. One example of the structure illustrated in FIG. 1 is disclosed in U.S. Pat. No. 5,367,253 to Wood et al. Substrate 10 has a first surface 12 with an array of first contact points 14 and an opposite second surface 16 with an array of second contact points 18. A semiconductor chip 20 is disposed on second surface 16 such that electrical contact elements 22 of semiconductor chip 20 are connected with second contact points 18.

In order to temporarily secure semiconductor chip 20 onto substrate 10, bridge structures 24 have commonly been used. The bridge structure may include support members in contact with substrate 10 for stabilizing bridge structure 24. Support members 26 may be attached to substrate 10 by means of slots (not shown) in the side of substrate 10 or by gripping first surface 12 of substrate 10. Furthermore, the bridge structure may include a substantially planar plate 28 attached to the support members 26. A leaf spring 30 is attached to plate 28 and extends to semiconductor chip 20. As bridge structure 24 is positioned on substrate 10 and is placed in contact with semiconductor chip 20, the leaf spring 30 is compressed toward plate 28 and exerts a downward force 32 onto semiconductor chip 20, thereby holding it in place over substrate 10.

While bridge structure 24 often functions suitably well for its intended purpose, there are some instances in which another system for temporarily holding a semiconductor chip on a substrate could be desirable. For example, as seen in FIG. 1, bridge structure 24 ordinarily extends a considerable distance above semiconductor chip 20. Often, however, it is desirable to reduce the amount of space above the semiconductor chip that must be occupied by the clamping apparatus in order to temporarily secure the semiconductor chip to testing circuitry.

In view of the foregoing, there is a need in the art for an improved structure for temporarily securing a semiconductor chip to testing circuitry. In particular, it would be advantageous to provide a chip carrier for securing a semiconductor chip while greatly reducing the amount of space needed above the semiconductor chip.

SUMMARY OF THE INVENTION

The present invention relates to chip carriers that used C-shaped clips for generating a force on a semiconductor chip in order to temporarily secure the semiconductor chip to contact points on a chip carrier. The clips generally do not extend to the region directly over the semiconductor chip. Preferably, the clips are instead positioned to the sides of the semiconductor chip and are placed in contact with a cover member that extends over the semiconductor chip. The clips exert a downward force on the cover member, which in turn presses the semiconductor chip onto the chip carrier substrate. The clips conveniently allow the semiconductor chip to be secured to and later removed from the substrate in connection with a testing procedure.

In one embodiment of the invention, the chip carrier includes a dielectric substrate having at least a first layer, which includes a printed circuit board or another suitable structure, such as a polyimide layer. Preferably, the substrate further includes a second layer on the first layer. The first layer has an array of first contact points on a lower surface thereof. The first contact points may be solder balls of a ball grid array, pins of a pin grid array, land pads of a land grid array, or the like, depending on the nature of the testing device to be used with the chip carrier. The second layer has an array of second contact points on a surface thereof. Alternatively, the substrate includes only the first layer, in which case the second contact points are arrayed over a surface of the first layer opposite the first contact points.

In either case, electrical traces connect the first contact points with the second contact points. Preferably, the first contact points are more widely spaced and have a greater pitch than the second contact points. This allows the electrical contact elements of semiconductor chip to effectively have an increased pitch when attached to the chip carrier, thereby facilitating the establishment of electrical connection with external circuitry of the testing device.

One method for using the chip carriers and the clips of the invention involves first positioning a semiconductor chip on the substrate such that contact elements of the semiconductor chip are connected with the second contact points of the substrate. A cover member is then disposed on the semiconductor chip opposite the contact elements thereof. The cover member may have a resilient layer at the interface with the semiconductor chip so as to provide a cushioning effect as the cover member presses down on the semiconductor chip.

The force by which the cover member presses down on the semiconductor chip is generated by one or more C-shaped clips compressively attached to the substrate. Preferably, the chip carrier utilizes at least two clips and most preferably four clips. The clips may have a first member in contact with the substrate and a second member separated from the first member and in contact with the cover member. In one embodiment of the invention, the first member of the clip is removably attached to the substrate by being fitted into a slot in the substrate. Furthermore, each chip preferably has an elbow segment integrally attached to both the first member and the second member.

When the semiconductor chip is received by the chip carrier, the clips are at least slightly deformed such that the distance of separation between the first member and the second member is increased beyond an equilibrium value. Such deformation of the clips produces a countervailing force tending to restore the clip to its predeformed state. Accordingly, the clips are preferably positioned so as to direct the countervailing force onto the cover member in order to press the cover member in the direction of the substrate. After the testing procedure has been conducted, the semiconductor chip may be removed from the chip carrier.

In view of the foregoing, it can be appreciated that the C-shaped clips and the chip carriers of the invention provide a system for easily and reliably securing a semiconductor chip to external circuitry. In addition, the use of the clips in combination with the cover member greatly reduces the amount of occupied space over the semiconductor in comparison to prior art devices. In particular, the clips preferably do not extend to the region directly over the semiconductor chips, but instead remain to the sides thereof.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

The present invention relates to chip carriers for temporarily receiving semiconductor chips and for temporarily connecting the semiconductor chips to external circuitry. In particular, the chip carriers include one or more C-shaped clips that generate a force that is transmitted to the semiconductor chip in order to secure the semiconductor chip to a substrate. In this manner, electrical contact elements of the semiconductor chip may be electrically engaged with external circuitry of a testing device. While a C-shape is preferred for the clips, other shapes that accomplish a similar function are also contemplated.

The C-shaped clips preferably have a first member attached to a substrate and a second member separated from the first member and in contact with a cover member. The cover member extends over the semiconductor chip in order to restrict motion of the semiconductor chip and to transmit forces thereto. The substrate includes an array of first contact points configured to electrically engage the external circuitry of a testing device, an array of second contact points configured to electrically engage the semiconductor chip, and a plurality of electrical traces extending therebetween.

Figure 1:
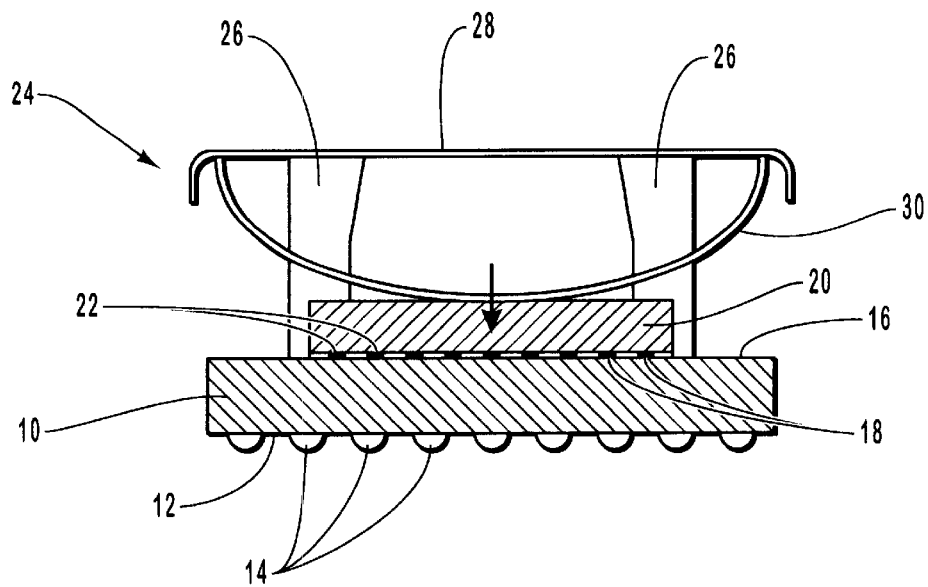
FIG. 1 is a cross-sectional elevation view of a prior art assembly wherein a bridge to structure is used to temporarily secure a semiconductor chip to a substrate.
Figure 2:
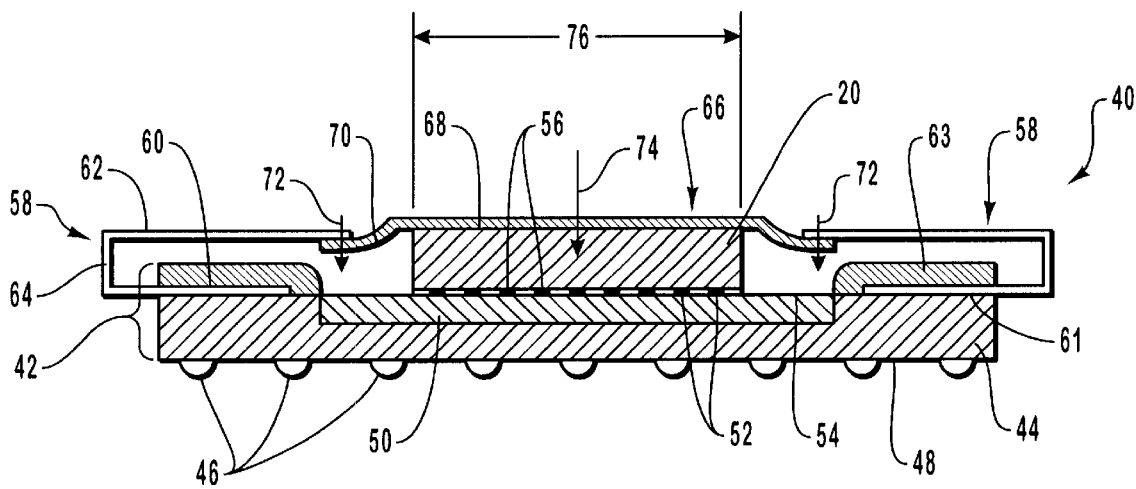
FIG. 2 is a cross-sectional elevation view of a chip carrier and semiconductor chip of the invention wherein a plurality of C-shaped clips are used to temporarily secure the semiconductor chip to a substrate.

FIG. 2 depicts one embodiment of a chip carrier of the invention with an associated semiconductor chip. The chip carrier 40 includes a substrate 42 over which semiconductor chip 20 may be positioned. Preferably, substrate 42 includes at least a first layer 44 having a plurality of first contact points 46 arrayed on a surface 48 thereof. Most preferably, first layer 44 includes a printed circuit board. Alternatively, first layer 44 may be a polyimide layer or another suitable structure.

Contact points 46 may be any suitable structure for establishing electrical connection between the external circuitry contained in a testing device and substrate 42. Generally, the particular structure used as contact points 46 is determined by the structure of the testing device to be used. FIG. 2 illustrates an array of solder balls as an example of contact points 46. Accordingly, a ball grid array may be disposed on surface 48 of first layer 44. Alternatively, contact points 46 may be pins arranged in a pin grid array, land pads arranged in a land grid array, or the like. It is noted that the particular type of structures used as contact points 46 is not critical to the invention.

Substrate 42 may advantageously include a second layer 50 disposed on first layer 44. Second layer 50 may be any suitable dielectric structural layer for supporting semiconductor chip 20 and may be attached to first layer 44 by means of an adhesive material or by other methods known in the art. Second layer 50 has an array of second contact points 52 positioned on a surface 54 thereof. Alternatively, if substrate 42 includes only first layer 44, then second contact points 52 are preferably arrayed on a surface of first layer 44 opposite surface 48. The specific structure of contact points 52 is generally determined by the nature of the corresponding contact elements 56 of semiconductor chip 20. For example, contact points 52 may be shallow pits or depressions formed into surface 54, conductive surfaces formed flush with surface 54, or protrusions extending above surface 54. In any event, contact points 52 should be configured to electrically engage the corresponding contact elements of 56 of semiconductor chip 20.

In many cases, the pitch of first contact points 46 is greater than the pitch of second contact points 52. The pitch of an array of electrically conductive structures is defined herein to be the distance between a point on one structure and a corresponding point on the nearest adjacent structure. When the pitch of first contact points 46 is greater than the pitch of second contact points 52, the chip carrier has the advantage of providing compatibility between relatively fine pitch semiconductor chips and testing devices that commonly have a larger pitch. Nevertheless, the size of the pitches of first contact points 46 and second contact points 52 may be selected according to any other relationship. Each first contact point 46 is preferably electrically connected to a corresponding second contact point 52 by means of electrical traces that extend through or over the surface of substrate 42 as will be disclosed in further detail hereinafter.

In order to temporarily mount semiconductor chip 20 to substrate 42, chip carrier 40 includes structures for exerting a force on semiconductor chip 20. Specifically, the chip carrier 40 preferably includes one or more clips 58. Each clip 58 has a first member 60 removably attached to substrate 42. One example of a suitable method of attaching first member 60 to substrate 42 is illustrated in FIG. 2, wherein a slot 61 is provided between first layer 44 and a clip attachment layer 63. The slot 61 may be sized to receive first member 60 and to allow clip 58 to be manually retracted from the slot. Furthermore, each clip 58 includes a second member 62 separated from first member 60 by a variable distance. First member 60 and second member 62 are preferably integrally connected to an elbow segment 64 included in clip 68.

A preferred clip of the invention exhibits spring-like properties, in that deformation thereof from a substantially unstressed state results in a force tending to return the clip to its substantially unstressed state. For example, if a second member 62 is displaced so as to increase the variable distance between first member 60 and second member 62 beyond an equilibrium value, a force is exerted on second member 62 which tends to return it to its predisplaced position. The force is generated by the combined action of the deformation of first member 60, second member 62, and elbow segment 64 or by any subset of the foregoing three elements of clip 58.

FIG. 2 depicts a clip 58 having a first member 60 and second member 62 that are substantially parallel one to another. However, first member 60 and second member 62 may have other suitable configurations. For example, second member 62 may be curved with the result that it is not parallel with first member 60. Likewise, elbow segment 64, which serves as a force generating member, may be shorter or longer than that which is depicted. Furthermore, first member 60 and second member 62 may be attached to elbow segment 64 in a smooth, curved fashion instead of the generally right angles depicted in FIG. 2.

Preferably, clips 58 do not extend to semiconductor chip 20 but are instead positioned to the sides thereof. A cover member 66 is favorably used to transmit forces from clips 58 to semiconductor chip 20. Cover member 66 may advantageously have a substantially planar central surface 68 adapted to be in contact with semiconductor chip 20 and an outer rim 70 adapted to be in contact with clips 58. As can be seen in FIG. 2, the outer rim 70 may be nearer substrate 42 than the substantially planar central surface 68.

When semiconductor chip 20 is disposed over substrate 42 and under cover member 66, second members 62 of clips 58 are preferably displaced from their original position in a direction away from substrate 42. Such displacement generates a force 72 on outer rim 70 of cover member 66 in the direction of substrate 42. Force 72 in turn generates a force 74 directed onto semiconductor chip 20 in the direction of substrate 42, thereby substantially securing semiconductor chip 20 in a desired position over substrate 42.

Chip carrier 40 may be adapted for use with a wide variety of semiconductor chips 20. For example, bare semiconductor dice may be used. Alternatively, chip carrier 40 may be adapted to receive some types of packaged semiconductor chips. In any event, chip carrier 40 is defined to include a chip-receiving region. In particular, the chip-receiving region is defined at least in part by surface 54 of substrate 42 and by clips 58 and is further defined by cover member 66. Accordingly, the chip-receiving region of chip carrier 40 includes the space intended to be, or actually occupied by, a semiconductor chip. For example, in FIG. 2, the chip-receiving region includes the space occupied by semiconductor chip 20.

As seen in FIG. 2, semiconductor chip 20 defines an exclusion region 76 thereabove. In particular, exclusion region 76 includes the space that begins at semiconductor chip 20 and extends perpendicularly away from substrate 42. Exclusion region 76 is laterally bounded by a perimeter that begins at the periphery of semiconductor chip 20 and extends perpendicularly away from substrate 42. The clips 58 of the invention preferably are included in chip carrier 40 outside of exclusion region 76. This generally has the result of greatly reducing the amount of space over semiconductor chip 20 that would otherwise be needed to secure semiconductor chip 20 to substrate 42.

Figure 3:
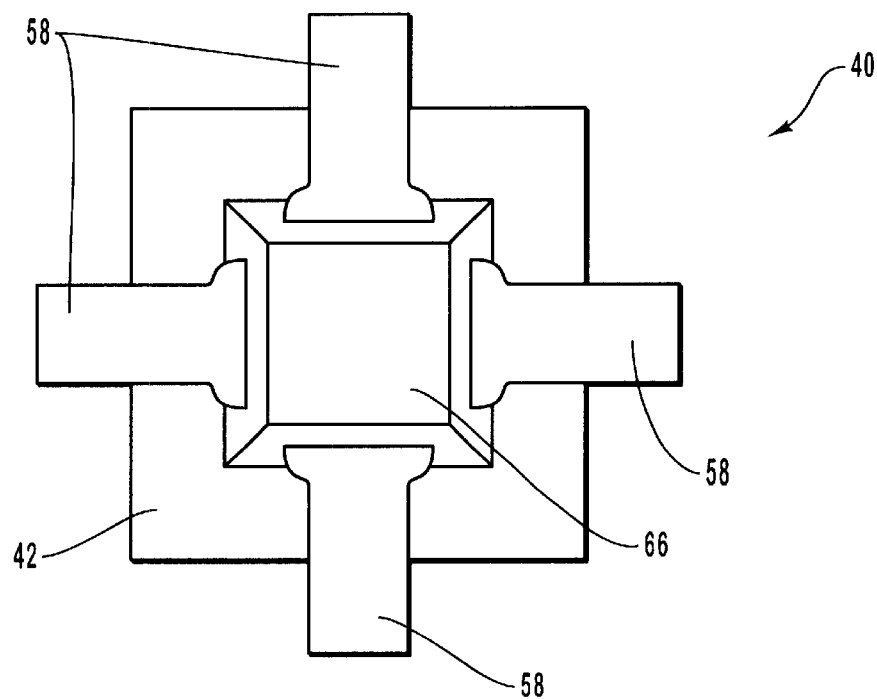
FIG. 3 is a top view of a chip carrier of the invention in which four C-shaped clips are used to secure a semiconductor chip to a substrate.
Figure 4:
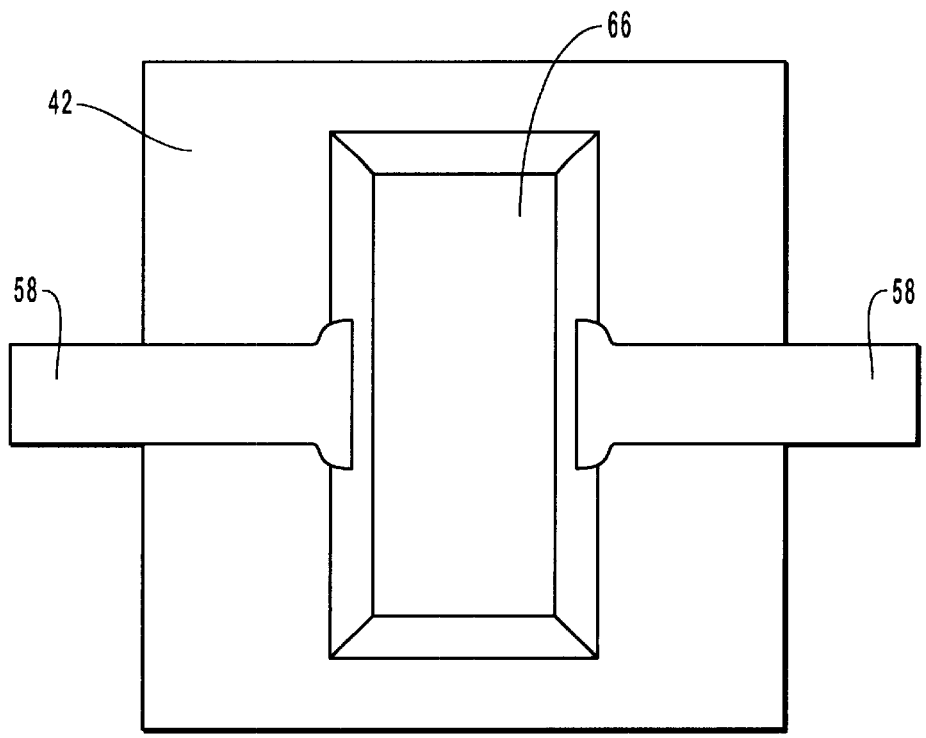
FIG. 4 is a top view of an alternative embodiment of the chip carriers of the invention wherein two C-shaped clips are used to temporarily secure a semiconductor chip to a substrate.

FIG. 3 depicts a preferred chip carrier 40 of the invention wherein four clips 58 are used to temporarily secure the semiconductor chip to the substrate. Four clips 58 are most preferred because the resulting chip carrier is generally more stable than chip carriers using fewer clips. However, as seen in FIG. 4, the invention also extends to chip carriers using fewer clips. Cover members 66 ordinarily have a rectangular profile as seen in FIGS. 3 and 4 so as to correspond to the rectangular shape of most semiconductor chips. However, shapes other than rectangles may be used as needed.

Figure 5:
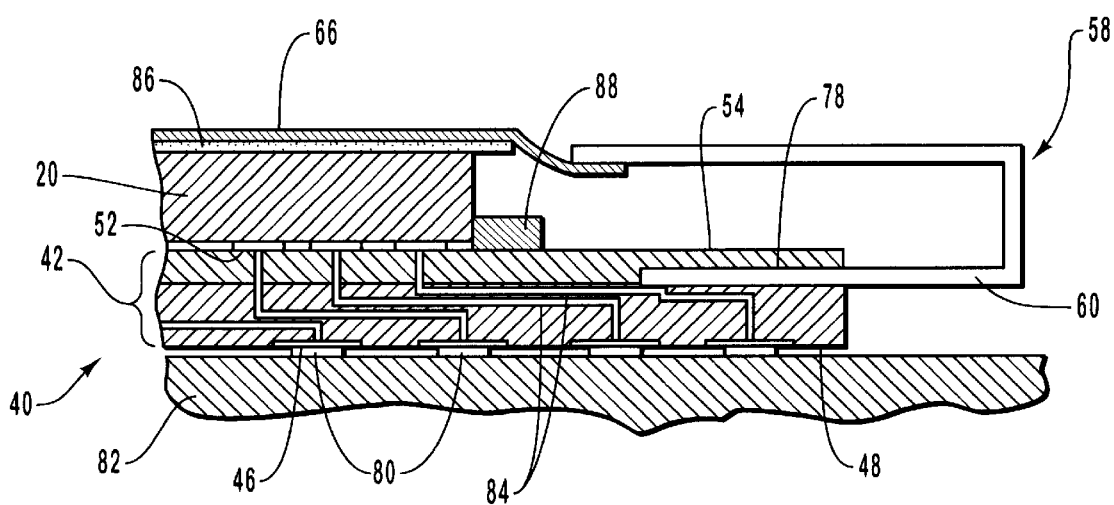
FIG. 5 is a partial cross-sectional elevation view of a semiconductor chip and a chip carrier of the invention connected to a testing device.

FIG. 5 depicts a portion of a chip carrier of the invention having been engaged with a semiconductor chip and a testing device. In FIG. 5, clip 58 is temporarily attached to substrate 42. The illustrated method for such temporary attachment is the use of a slot 78 formed in substrate 42 into which first member 60 of clip 58 is inserted. Optionally, first member 60 of clip 58 may instead be biased against surface 48 of substrate 42. However, this method of temporarily securing clip 58 is not as preferred because it reduces the available amount of surface 48 over which the array of contact points 46 may be positioned. Temporary attachment of clips 58 to substrate 42 provides the advantage of allowing unobstructed access to substrate 42 before clips 58 have been disposed thereon. For example, a process using chip carrier 40 may include positioning semiconductor chip 20 on substrate 42 in the absence of clips 58, followed by the temporary attachment of clips 58 to secure the semiconductor chip in its selected position.

As seen in FIG. 5, when the chip carriers of the invention are used to connect a semiconductor chip to a testing device, first contact points 46 are electrically engaged with contact structures 80 of the testing device 82. The substrate 42 may be conveniently attached to the testing device 82 either permanently, semi-permanently, or temporarily. In contrast to the example of first contact points 46 depicted in FIG. 2, first contact points 46 of FIG. 5 are land pads that are brought into contact to corresponding contact structures 80 on testing structure 82. Contact structures 80 can be electrically conductive probes in communication with testing device 82. As previously disclosed, first contact points 46 may be any of a wide variety of structures depending on the nature of the contact structures of the testing device.

FIG. 5 further depicts electrical traces 84 that extend through substrate 42 between first contact points 46 and second contact points 52. Electrical traces 84 may be any internal or external conductive paths formed in a manner which will be understood by one of ordinary skill of the art upon learning of the present invention.

Also illustrated in FIG. 5 is a resilient layer 86 which is optionally included in cover member 66. Resilient layer 86, when included in the invention, provides a cushioning effect on semiconductor chip 20. In particular, resilient layer 86 may be positioned on a face of cover member 66 and in contact with semiconductor chip 20 in order to distribute forces substantially uniformly over semiconductor chip 20. Resilient layer 86 may be constructed of a silicone elastomeric foam or another suitable material that may be resiliently compressed during operation of the chip carriers of the invention.

FIG. 5 depicts one method for aligning the semiconductor chip with the corresponding second contact points of the substrate. In particular, fence 88 is a lateral-restraint structure that is positioned on surface 54 of substrate 42 so as to preferably substantially encircle semiconductor chip 20. Fence 88, if used in the invention, should at least extend around enough of semiconductor chip 20 in order to restrict motion of semiconductor chip 20 in any direction parallel to the plane defined by surface 54. Lateral-restraint structures such as fence 88 may be advantageously used in the invention when the tolerances of semiconductor chip 20 and chip carrier 40 are sufficiently tight to allow second contact point 52 of semiconductor chip 20 to be repeatedly and reliably connected to the corresponding first contact points 46.

In situations where the use of a fence cannot reliably align a semiconductor chip with a chip carrier, other options exist for providing reliable electrical contact. For example, optical alignment processes, which are known by those skilled in the art, may be used to adequately position semiconductor chip over substrate 42.

Figure 6A:
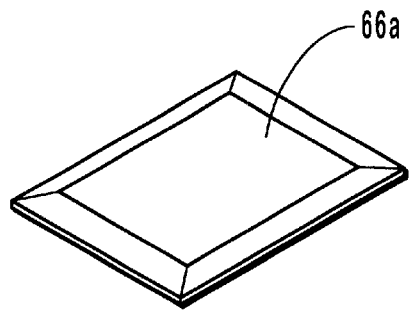
FIGS. 6A–6D are perspective views of alternative cover members according to the invention.
Figure 6B:
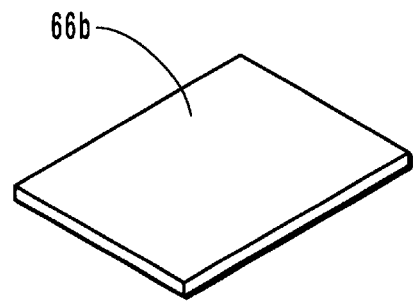
Figure 6C:
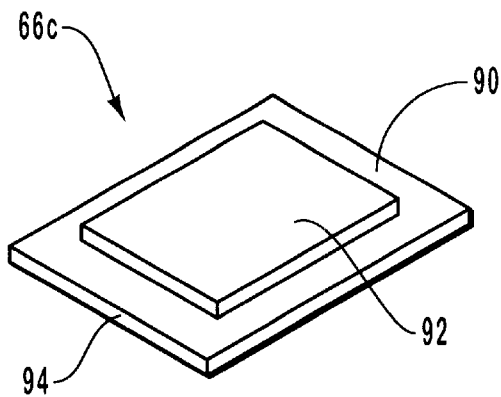
Figure 6D:
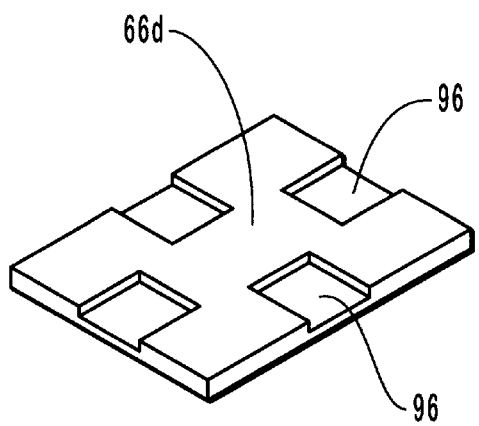

FIGS. 6A–6D illustrate various alternative designs of the cover members that can be used with the present invention. For example, FIG. 6A depicts a cover member 66a similar to cover member 66 of FIG. 2. Cover member 66a may be formed from a sheet of a metal or polymeric material in a stamping operation. Cover member 66b of FIG. 6B is simply a flat segment of a sheet of a metal or polymeric material. FIG. 6C illustrates a multi-level cover member 66c that may be formed in a milling operation, wherein shoulder 90 is formed. Alternatively, cover member 66c may comprise a first layer 92 attached to a second layer 94. FIG. 6D shows yet another example of a suitable cover member 66d that may be formed from a milling operation or from two layers as described above in reference to FIG. 6C. Cover member 66d includes optional notches 96 for receiving the second member of the clips and for substantially restraining lateral motion of cover member 66d relative to the clips.

Figure 7:
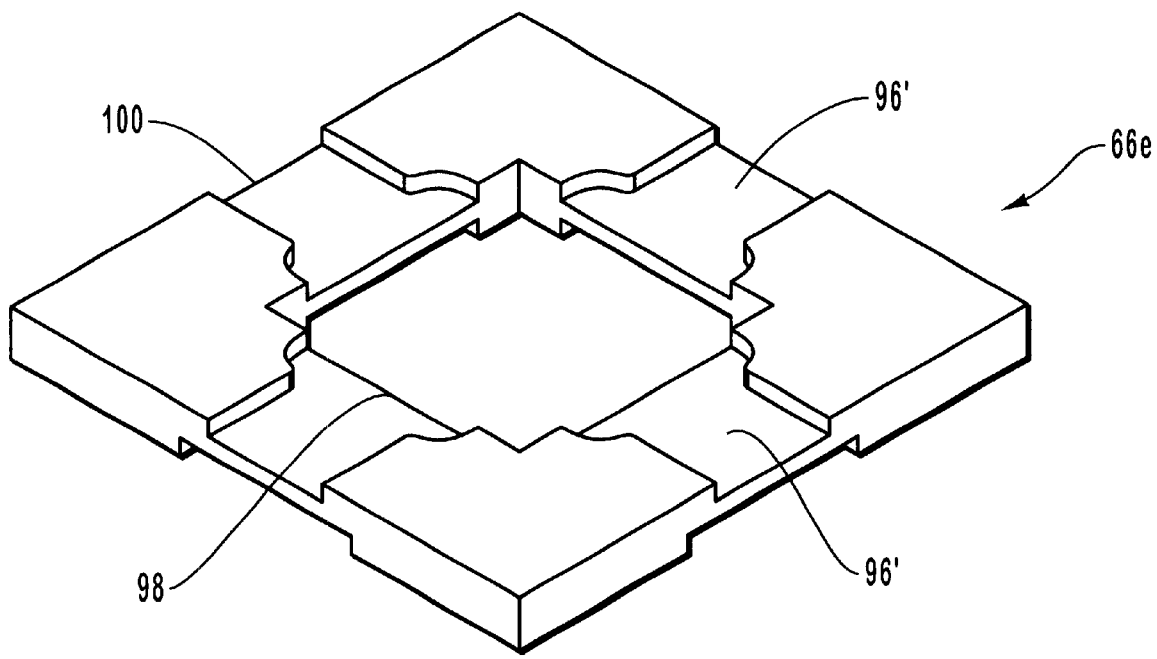
FIG. 7 is a perspective view of yet another cover member that may be used with the invention.

FIG. 7 illustrates yet another example of a suitable cover member. In particular, cover member 66e has a plurality of notches 96' configured to receive the second members of the corresponding clips. Notches 96' may be configured to facilitate the secure retention of the clips therewithin. For example, notches 96' as illustrated in FIG. 7 have a greater width at a first end 98 near the center of cover member 66e than the width thereof at a second end 100 near the periphery of the cover member. The tapering profile of notches 96' is such that suitably dimensioned clips may be mechanically locked in position therein.

Figure 8:
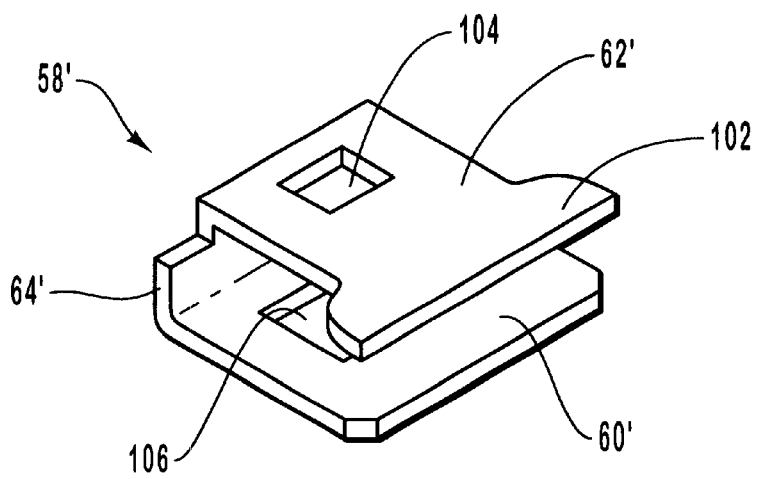
FIG. 8 is a perspective view of a clip that is configured to be received by notches formed on the cover member of FIG. 7.

One example of a suitable clip for use with notches 96' is illustrated in FIG. 8. Clip 58' has a second member 62' that tapers outward as it extends from elbow member 64'. The tapering profile of second member 62' may result in an flange 102 being positioned at the distal end of second member 62'. As can be seen in FIGS. 7 and 8, flange 102 and the tapering profile of second member 62' correspond to the tapering profile of notches 96'. Such design of notches 96' and second members 62' further allow cover member 66e to be securely positioned over the associated semiconductor chip during the testing operation.

Clip 58' further includes optional features for facilitating separation of the clip from the associated cover member. For example, hole 104 may be formed through second member 62' to simplify the process of retracting second member 62' from cover member 66e. Likewise, hole 106 can provide the same functionality with respect to the retraction of first member 60' from the substrate assembly.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A structure for receiving a semiconductor chip, said structure comprising:
   a first substrate layer having a plurality of first contact points on a surface thereof, wherein said first substrate layer comprises a printed circuit board;
   a second substrate layer disposed on said first substrate layer, said second substrate layer including a plurality of second contact points on a surface thereof, said plurality of first contact points being connected to said plurality of second contact points by a plurality of electrical traces;
   a cover member disposed over and separate from said second substrate layer; and
   one or more clips for generating a force on said cover member toward said second substrate layer, each of said one or more clips including:
      a first member that contacts both of said first substrate layer and said second substrate layer;
      a second member displaced from said first member; and
      an elbow segment integrally attached to both of said first member and said second member, said elbow segment generating at least path of said force on said cover member upon being deformed.

2. A structure, for receiving a semiconductor chip, said structure comprising:

a first substrate layer having a plurality of first contact points on a surface thereof, wherein said first substrate layer comprises a polyimide material;

a second substrate layer disposed on said first substrate layer, said second substrate layer including a plurality of second contact points on a surface thereof, said plurality of first contact points being connected to said plurality of second contact points by a plurality of electrical traces;

a cover member disposed over and separated from said second substrate layer; and one or more clips for generating a force on said cover member toward said second substrate layer, each of said one or more clips including:
 a first member that contacts both of said first substrate layer and said second substrate layer;
 a second member displaced from said first member; and
 an elbow segment integrally attached to both of said first member and said second member, said elbow segment generating at least part of said force on said cover member upon being deformed.

3. A structure for receiving a simiconductor chip, said structure comprising:

a first substrate layer having a plurality of first contact points on a surface thereof;

a second substrate layer disposed on said first substrate layer, said second substrate layer including a plurality of second contact points on a surface thereof, said plurality of first contact points being connected to said plurality of second contact points by a plurality of electrical traces;

a cover member disposed over and separated from said second substrate layer; and one or more clips for generating a force on said cover member toward said second substrate layer, wherein said one or more clips consists of four clips, each of said four clips including:
 a first member that contacts both of said first substrate layer and said second substrate layer;
 a second member displaced from said first member; and
 an elbow segment integrally attached to both of said first member and said second member, said elbow segment generating at least part of said force on said cover member upon being deformed.

4. A structure as defined in claim 3, wherein said second substrate layer is generally rectangular such that each of four sides of said second substrate layer has one of said four clips attached thereto.

5. A structure for receiving, a semiconductor chip, said structure comprising;

a first substrate layer having a plurality of first contact points on a surface thereof;

a second substrate layer disposed on said first substrate layer, said second substrate layer including a plurality of second contact points on a surface thereof, said plurality of first contact points being connected to said plurality of second contact points by a plurality of electrical traces;

a cover member disposed over and separated from said second substrate layer; and one or more clips for generating a force on said cover member toward said second substrate layer, each of said one or more clips including;
 a first member that contacts both of said first substrate layer and said second substrate layer;
 a second member displaced from said first member, wherein said second member of each of said one or more clips has an outwardly tapering profile corresponding to a profile of a notch in said cover member, whereby said one or more clips are mechanically locked in position with respect to said cover member; and
 an elbow segment integrally attached to both of said first member and said second member, said elbow segment generating at least part of said force on said cover member upon being deformed.

6. A structure for receiving a semiconductor chip, said structure comprising:

a substrate having a plurality of first contact points on a first surface and a plurality of second contact points on a second surface, the substrate further having an attachment layer opposite to tho first surface, and a first layer opposite to the second surface, with a plurality of slots between the attachment layer and the first layer;

a plurality of clips in contact with said substrate each including:
 a first member in contact with said substrate at least partially inserted into one of said slots;
 a second member separated from said first member by a variable distance; and
 an elbow segment integrally attached to both said first member and said second member, wherein said elbow segment generates a force tending to move said second member nearer to said first member when said variable distance is greater than an equilibrium value; and a chip receiving region at least partially defined by said second surface of said substrate and by said one or more clips.

7. A structure as defined in claim 6, wherein said plurality of clips comprises at least two of said clips.

8. A structure as defined in claim 6, wherein said plurality of clips comprises at least four of said clips.

9. A structure as defined in claim 6, further comprising a cover member having a substantially planar surface, said cover member being in contact with said plurality of clips and further defining said chip receiving region.

10. A structure as defined in claim 6, wherein said plurality of first contact points on said first surface comprise solder balls of a ball grid array.

11. A structure as defined in claim 6, wherein said plurality of first contract points on said first surface comprise pins of a pin grid array.

12. A structure as defined in claim 6, wherein said plurality of first contact points on said first surface comprise land pads of a land grid array.

13. An assembly for connecting a semiconductor chip to external circuitry, said assembly comprising:

a substrate having a plurality of first contact points on a first surface and a plurality of second contact points on a second surface;

a semiconductor chip disposed on said substrate such that a plurality of contact elements of said semiconductor chip are in contact with said plurality of second contact points;

a cover member disposed on said semiconductor chip and having a central surface and an outer rim that is nearer said substrate than said central surface; and one or more clips in contact with said substrate each generating a force on said cover member to secure said semiconductor chip on said substrate.

14. An assembly as defined in claim 13, wherein said cover member comprises a resilient layer in contact with said semiconductor chip, said resilient member being compressed.

15. An assembly as defined in claim 13, wherein each of said one or more clips comprises:
   a first member attached to said substrate;
   a second member separated from said first member by a variable distance and positioned in contact with said cover member so as to transmit said force to said cover member; and
   an elbow segment integrally attached to both said first member and said second member, wherein said elbow segment generates at least part of said force.

16. An assembly as defined in claim 13, wherein said one or more clips are removably attache to said substrate by being fitted into slots in said substrate.

17. An assembly as defined in claim 13, wherein said one or more clips comprise a plurality of clips.

18. An assembly as defined in claim 13, further comprising an exclusion region beginning at said semiconductor chip and extending perpendicularly away from said substrate, said exclusion region being laterally bounded by a perimeter beginning at the periphery of said semiconductor chip and extending perpendicularly away from said substrate, wherein said one or more clips are positioned in said assembly outside of said exclusion region.

19. An assembly for connecting a semiconductor chip to external circuitry, said assembly comprising:
   a substrate having a plurality of first contact points having a first pitch on a first surface and a plurality of second contact points having a second pitch less than the first pitch on a second surface, the substrate further having an attachment layer opposite to the first surface, and a first layer opposite to the second surface, with at least one slot between the attachment layer and the first layer;
   a semiconductor chip disposed on said substrate such that a plurality of contact elements of said semiconductor chip are in contact with said plurality of second contact points;
   an exclusion region beginning at said semiconductor chip and extending perpendicularly away from said substrate, said exclusion region being laterally bounded by a perimeter beginning at the periphery of said semiconductor chip and extending perpendicularly away from said substrate;
   a cover member disposed of said semiconductor chip; and
   one or more clips contacting said substrate within said it least one slot, each generating a force on said cover member to secure said semiconductor chip on said substrate, said one or more clips being positioned outside of the exclusion region.

20. An assembly as defined in claim 19, wherein said force on said cover member generated by said one or more clips is in a direction generally toward said substrate.

21. An assembly as defined in claim 19, further comprising a testing device containing said external circuitry, wherein said external circuitry is electrically connected to said plurality of first contact points.

22. An assembly as defined in claim 19, wherein said plurality of first contact points are selected from the group consisting of solder balls, pins, and land pads.

23. An assembly as defined in claim 19, wherein said one or more clips comprise a plurality of clips.

24. An assembly for connecting a semiconductor chip to external circuitry, said assembly comprising:
   a substrate having a plurality of first contact points on a first surface and a plurality of second contact points on a second surface, said substrate further comprising a first layer adjacent to said first surface and a second layer on said first layer and adjacent to said second surface, and wherein said first layer comprises a printed circuit board;
   a semiconductor chip disposed on said substrate such that a plurality of contact elements of said semiconductor chip are in contract with said plurality of second contact points;
   a cover member disposed on said semiconductor chip;
   a plurality of clips each attached within the substrate and generating a force on said cover in member that secures said semiconductor chip on said substrate; and
   a testing device including said external circuitry, wherein said external circuitry is electrically connected to said plurality of first contact points.

25. An assembly for connecting a semiconductor chip to external circuitry, said assembly comprising:
   a substrate having a plurality of first contact points on a first surface and a plurality of second contact points on a second surface, said substrate further comprising a first layer adjacent to said first surface and a second layer on said first layer and adjacent to said second surface, and wherein said first layer comprises a polyimide material;
   a semiconductor chip disposed on said substrate such that a plurality of contact elements of said semiconductor chip are in contact with said plurality of second contact points;
   a cover member disposed on said semiconductor chip;
   a plurality of clips each attached within the substrate and generating a force on said cover member that secures said semiconductor chip on said substrate; and
   a testing device including said external circuitry, wherein said external circuitry is electrically connected to said plurality of first contact points.

26. An assembly for connecting a semiconductor chip to external circuitry, said assembly comprising:
   a substrate having a plurality of first contact points on a first surface and a plurality of second contact points on a second surface;
   a semiconductor chip disposed on said substrate such that a plurality of contact elements of said semiconductor chip are in contact with said plurality of second contact points;
   a cover member disposed on said semiconductor chip;
   a plurality of clips each attached within the substrate and generating a force on said cover member that secures said semiconductor chip on said substrate;
   a testing device including said external circuitry, wherein said external circuitry is electrically connected to said plurality of first contact points; and
   wherein said a plurality of clips consists of four clips, and said substrate is substantially rectangular such that each of four sides of said substrate has one of said four clips attached thereto.

* * * * *

UNITED STATES PATENT AND TRADEMARK OFFICE
CERTIFICATE OF CORRECTION

PATENT NO. : 6,351,034 B1 Page 1 of 1
DATED : February 26, 2002
INVENTOR(S) : Warren M. Farnworth, Derek Gochnour and Alan Wood It is certified that error appears in the above-identified patent and that said Letters Patent is hereby corrected as shown below:

Column 5,
Line 53, after "that" change "arc" to -- are --

Column 8,
Line 54, after "over and" change "separate" to -- separated --
Line 64, after "least" change "path" to -- part --

Column 9,
Line 22, after "receiving a" change "simiconductor" to -- semiconductor --

Column 11,
Line 51, after "within said" change "it" to -- at --

Signed and Sealed this

Third Day of December, 2002

JAMES E. ROGAN
*Director of the United States Patent and Trademark Office*